US011400559B2

(12) United States Patent
Joeng et al.

(10) Patent No.: US 11,400,559 B2
(45) Date of Patent: Aug. 2, 2022

(54) POLISHING PAD, PROCESS FOR PREPARING THE SAME, AND PROCESS FOR PREPARING A SEMICONDUCTOR DEVICE USING THE SAME

(71) Applicant: SKC solmics Co., Ltd., Gyeonggi-do (KR)

(72) Inventors: Eun Sun Joeng, Ulsan (KR); Jong Wook Yun, Gyeonggi-do (KR); Sunghoon Yun, Gyeonggi-do (KR); Jang Won Seo, Gyeonggi-do (KR)

(73) Assignee: SKC solmics CO., LTD., Gyeonggi-do (KR)

( * ) Notice: Subject to any disclaimer, the term of this patent is extended or adjusted under 35 U.S.C. 154(b) by 0 days.

(21) Appl. No.: 17/002,427

(22) Filed: Aug. 25, 2020

(65) Prior Publication Data
US 2021/0129285 A1 May 6, 2021

(30) Foreign Application Priority Data

Oct. 30, 2019 (KR) .................. 10-2019-0136301
Nov. 5, 2019 (KR) .................. 10-2019-0140481

(51) Int. Cl.
*B24B 37/24* (2012.01)
*B24B 37/04* (2012.01)
(Continued)

(52) U.S. Cl.
CPC ............ *B24B 37/24* (2013.01); *B24B 37/042* (2013.01); *B24D 11/003* (2013.01); *H01L 21/31053* (2013.01); *H01L 21/3212* (2013.01)

(58) Field of Classification Search
CPC ....... B24B 37/24; B24B 37/20; B24B 37/205; B24B 37/245; B24B 37/26; B24D 11/003; B24D 3/28; B24D 3/32
See application file for complete search history.

(56) References Cited

U.S. PATENT DOCUMENTS 6,362,107 B1    3/2002  Shiro et al.
6,840,971 B2 *  1/2005  Wang ..................... C23F 3/06
                                                          51/307
(Continued)

FOREIGN PATENT DOCUMENTS

JP    2003-145414 A    5/2003
JP    2004-043768 A    2/2004
(Continued)

OTHER PUBLICATIONS

Office Action issued in corresponding Taiwanese Patent Application No. 109128823, dated Aug. 11, 2021, 8 pages.
(Continued)

*Primary Examiner* — Joel D Crandall
(74) *Attorney, Agent, or Firm* — IP & T Group LLP

(57) ABSTRACT

The polishing pad according to an embodiment adjusts the content of elements present in the polishing layer, thereby controlling the bonding strength between the polishing pad and the polishing particles and enhancing the bonding strength between the polishing particles and the semiconductor substrate (or wafer), resulting in an increase in the polishing rate. It is possible to enhance not only the mechanical properties of the polishing pad such as hardness, tensile strength, elongation, and modulus, but also the polishing rate for both a tungsten layer or an oxide layer. Accordingly, it is possible to efficiently fabricate a semiconductor device of excellent quality using the polishing pad.

20 Claims, 3 Drawing Sheets

(51) Int. Cl.
    *H01L 21/321*     (2006.01)
    *H01L 21/3105*     (2006.01)
    *B24D 11/00*     (2006.01)

(56) References Cited

U.S. PATENT DOCUMENTS

2006/0280930 A1    12/2006  Shimomura et al.
2007/0224919 A1*   9/2007  Li ........................ H01L 21/3212
                                                                                       451/41

FOREIGN PATENT DOCUMENTS

| JP | 2015-120772 A | 7/2015 | | |
|---|---|---|---|---|
| JP | 2017-503670 A | 2/2017 | | |
| KR | 10-1290490 B1 | 7/2013 | | |
| KR | 10-2014-0025453 A | 3/2014 | | |
| KR | 10-2016-0132882 A | 11/2016 | | |
| KR | 10-2019-0029473 A | 3/2019 | | |
| WO | 00/27589 A1 | 5/2000 | | |
| WO | WO-0246283 A1 * | 6/2002 | ......... | C08G 18/0895 |

OTHER PUBLICATIONS

Office Action issued by the Korean Patent Office on Jan. 8, 2021.
Office Action issued by the Korean Patent Office on Jan. 21, 2021.
Office Action issued by the Japanese Patent Office dated Oct. 12, 2021.
Office Action issued by the Japanese Intellectual Property Office for JP 2020-147669 dated May 31, 2022.

* cited by examiner

[Fig. 1]
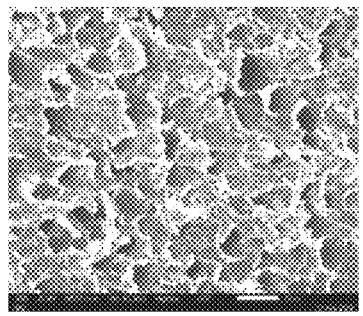
[Fig. 2]
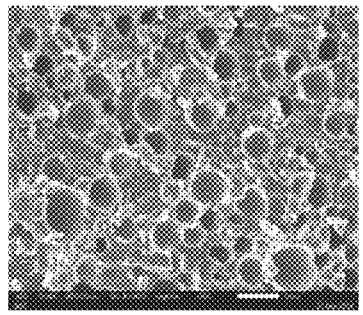

[Fig. 3]
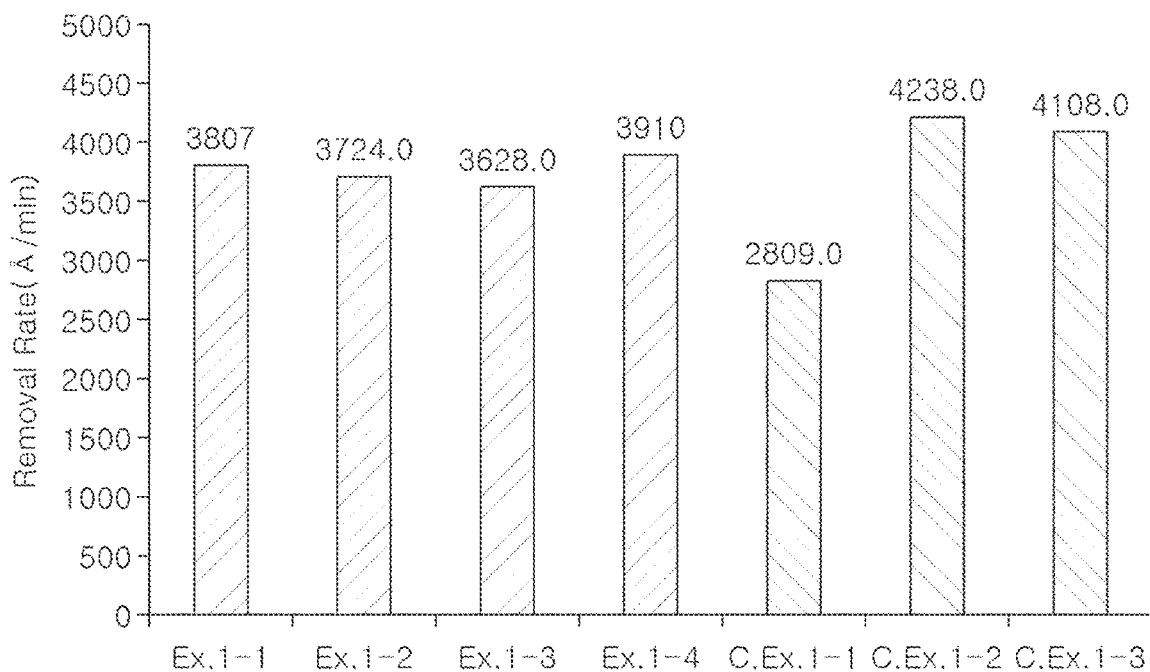
[Fig. 4]
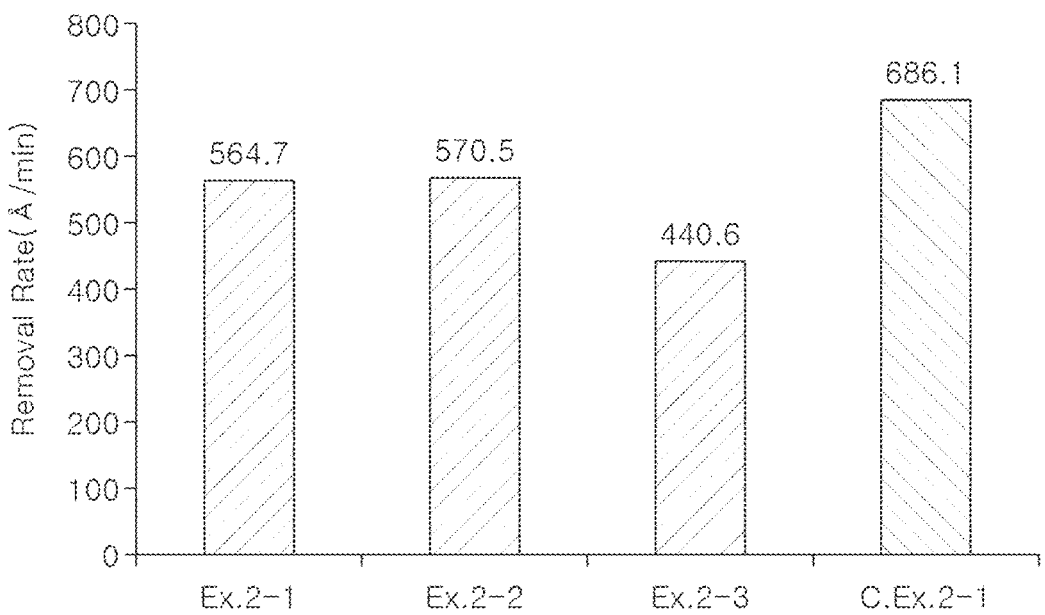

[Fig. 5]
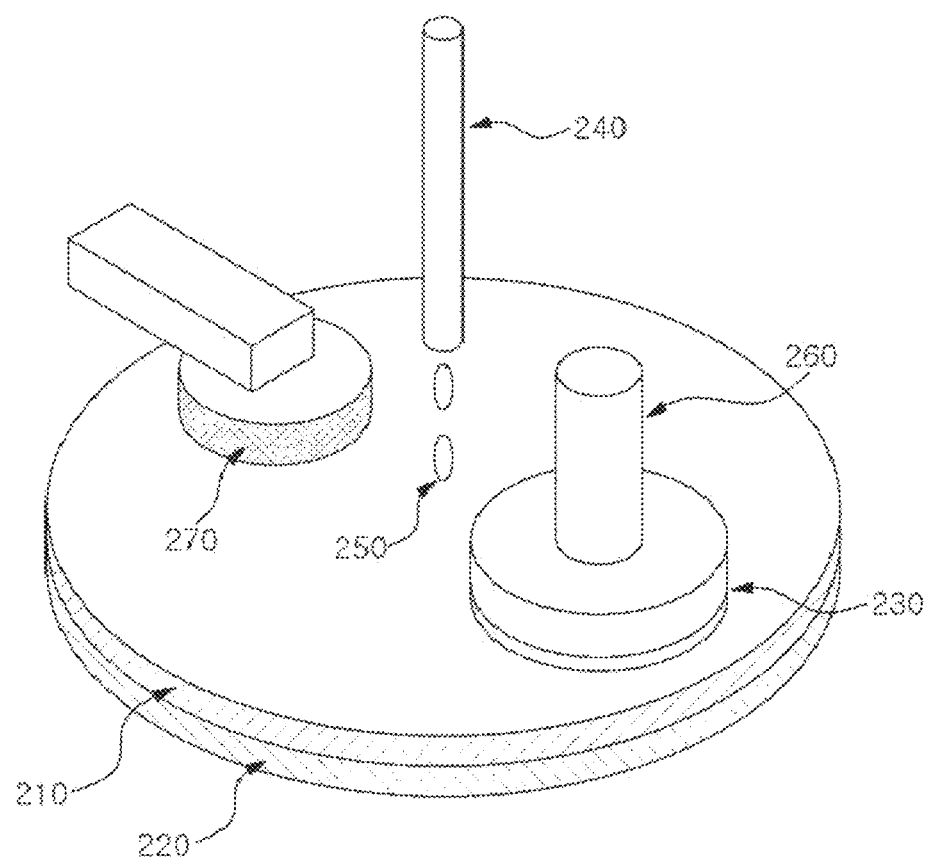

POLISHING PAD, PROCESS FOR PREPARING THE SAME, AND PROCESS FOR PREPARING A SEMICONDUCTOR DEVICE USING THE SAME

The present application claims priority of Korean patent application number 10-2019-0136301 filed on Oct. 30, 2019 and 10-2019-0140481 filed on Nov. 5, 2019, which is incorporated herein by reference in its entirety.

TECHNICAL FIELD

Embodiments relate to a polishing pad for use in a chemical mechanical planarization (CMP) process of semiconductors, a process for preparing the same, and a process for preparing a semiconductor device using the same.

BACKGROUND ART

The chemical mechanical planarization (CMP) process in a process for preparing semiconductors refers to a step in which a semiconductor substrate such as a wafer is fixed to a head and in contact with the surface of a polishing pad mounted on a platen, and the surface of the semiconductor substrate is then chemically treated by supplying a slurry while the platen and the head are relatively moved, to thereby mechanically planarize the irregularities on the surface of the semiconductor substrate.

A polishing pad is an essential member that plays an important role in such a CMP process. In general, a polishing pad is composed of a polyurethane resin, which comprises a urethane-based prepolymer obtained by reacting a diisocyanate compound and a polyol, a curing agent, a foaming agent, and the like.

The urethane-based prepolymer may have characteristics and physical properties that vary with the type and content of the diisocyanate compound and the polyol used for the polymerization, which physical properties may have a significant impact on the performance of the CMP process. Thus, it is a crucial factor that can significantly change the characteristics of a CMP pad to adjust not only the physical properties of a urethane-based prepolymer but also the physical properties of a polishing pad.

In addition, since the polishing layer of a polishing pad prepared from the above components directly interacts with the surface of a semiconductor substrate during the CMP process, it may affect the processing quality of the surface of the semiconductor substrate. In particular, the polishing rate in the CMP process sensitively varies with the components and physical properties of the polishing layer.

Accordingly, in order to enhance the polishing rate in the CMP process, there is an urgent demand for developing a polishing pad whose optimum range of physical properties and polishing rate conditions can be designed by adjusting the composition and physical properties of the polishing layer.

DETAILED DESCRIPTION OF THE INVENTION

Technical Problem

As a result of continuous research based on a recognition that the types and contents of the components used in the preparation of a polishing pad have an impact on the processing quality of the surface of a semiconductor substrate, which may sensitively change the polishing rate, it has been discovered that the physical properties including the hardness of the polishing pad significantly vary with the contents of the respective elements present in the polishing layer, and the bonding strength between the polishing pad and the polishing particles, along with the bonding strength between the polishing particles and the semiconductor substrate, is changed, which has an impact on the CMP performance such as polishing rate.

Accordingly, an object of the embodiments is to provide a polishing pad whose polishing rate can be significantly enhanced by adjusting the content of the oxygen (O) element and the total content of the nitrogen (N) and oxygen (O) elements in the polishing layer.

Another object of the embodiments is to provide a polishing pad whose physical properties can be significantly enhanced by adjusting the content of the nitrogen (N) element and the total content of the nitrogen (N), carbon (C), oxygen (O), and hydrogen (H) elements in the polishing layer.

Still another object of the embodiments is to provide a process for preparing the polishing pad and a process for preparing a semiconductor device using the polishing pad.

Solution to the Problem

According to an embodiment, there is provided a polishing pad, which comprises a polishing layer comprising a cured product of a composition comprising a urethane-based prepolymer, a curing agent, and a foaming agent, wherein the content of the oxygen (O) element in the polishing layer is 15% by weight to 19% by weight based on the total weight of the polishing layer, and the total content of the nitrogen (N) and oxygen (O) elements in the polishing layer is 20% by weight to 27% by weight based on the total weight of the polishing layer.

According to another embodiment, there is provided a polishing pad, which comprises a polishing layer comprising a cured product of a composition comprising a urethane-based prepolymer, a curing agent, and a foaming agent, wherein the content of the nitrogen (N) element in the polishing layer is 7% by weight or more based on the total weight of the polishing layer, and the total content of the nitrogen (N), carbon (C), oxygen (O), and hydrogen (H) elements in the polishing layer is 90% to 96% by weight based on the total weight of the polishing layer.

According to another embodiment, there is provided a process for preparing a polishing pad, which comprises sequentially or simultaneously mixing a urethane-based prepolymer, a curing agent, and a foaming agent to prepare a composition; and injecting the composition into a mold and curing it to form a polishing layer, wherein the content of the oxygen (O) element in the polishing layer is 15% by weight to 19% by weight based on the total weight of the polishing layer, and the total content of the nitrogen (N) and oxygen (O) elements in the polishing layer is 20% by weight to 27% by weight based on the total weight of the polishing layer.

According to another embodiment, there is provided a process for preparing a polishing pad, which comprises sequentially or simultaneously mixing a urethane-based prepolymer, a curing agent, and a foaming agent to prepare a composition; and injecting the composition into a mold and curing it to form a polishing layer, wherein the content of the nitrogen (N) element in the polishing layer is 7% by weight or more based on the total weight of the polishing layer, and the total content of the nitrogen (N), carbon (C), oxygen (O), and hydrogen (H) elements in the polishing layer is 90% to 96% by weight based on the total weight of the polishing layer.

According to another embodiment, there is provided a process for preparing a semiconductor device, which comprises mounting a polishing pad comprising a polishing layer on a platen; and relatively rotating the polishing surface of the polishing layer and the surface of a semiconductor substrate while they are in contact with each other to polish the surface of the semiconductor substrate, wherein the polishing pad comprises the polishing layer comprising a cured product of a composition comprising a urethane-based prepolymer, a curing agent, and a foaming agent, the content of the oxygen (O) element in the polishing layer is 15% by weight to 19% by weight based on the total weight of the polishing layer, and the total content of the nitrogen (N) and oxygen (O) elements in the polishing layer is 20% by weight to 27% by weight based on the total weight of the polishing layer.

According to another embodiment, there is provided a process for preparing a semiconductor device, which comprises mounting a polishing pad comprising a polishing layer on a platen; and relatively rotating the polishing surface of the polishing layer and the surface of a semiconductor substrate while they are in contact with each other to polish the surface of the semiconductor substrate, wherein the polishing pad comprises the polishing layer comprising a cured product of a composition comprising a urethane-based prepolymer, a curing agent, and a foaming agent, the content of the nitrogen (N) element in the polishing layer is 7% by weight or more based on the total weight of the polishing layer, and the total content of the nitrogen (N), carbon (C), oxygen (O), and hydrogen (H) elements in the polishing layer is 90% to 96% by weight based on the total weight of the polishing layer.

Advantageous Effects of the Invention

The polishing pad according to an embodiment adjusts the content of the elements present in the polishing layer, in particular, the content of the oxygen (O) element and the total content of the oxygen (O) and nitrogen (N) elements, thereby controlling the bonding strength between the polishing particles and the polishing pad and enhancing the bonding strength between the polishing particles and the semiconductor substrate (or wafer), resulting in an increase in the polishing rate.

The polishing pad according to another embodiment adjusts the content of the elements present in the polishing layer, in particular, the content of the nitrogen (N) element and the total content of the nitrogen (N), carbon (C), oxygen (O), and hydrogen (H) elements, thereby significantly enhancing the physical properties of the polishing pad such as hardness, tensile strength, elongation, and modulus and the polishing rate thereof.

Further, it is possible to efficiently fabricate a semiconductor device of excellent quality using the polishing pad.

BRIEF DESCRIPTION OF THE DRAWINGS

FIG. 1 is a scanning electron microscope (SEM) image of a cross-section of the polishing pad prepared in Example 2-1.

FIG. 2 is a scanning electron microscope (SEM) image of a cross-section of the polishing pad prepared in Comparative Example 2-1.

FIG. 3 shows the polishing rates of the polishing pads prepared in Examples 1-1 to 1-4 and Comparative Examples 1-1 to 1-3.

FIG. 4 shows the polishing rates of the polishing pads prepared in Examples 2-1 to 2-3 and Comparative Example 2-1.

FIG. 5 schematically illustrates the process for preparing a semiconductor device according to an embodiment.

BEST MODE FOR CARRYING OUT THE INVENTION

Hereinafter, the present invention will be described in detail.

In the description of the following embodiments, in the case where each layer, pad, or sheet is mentioned to be formed "on" or "under" another layer, pad, or sheet, it means not only that one element is directly formed on or under another element, but also that one element is indirectly formed on or under another element with other element(s) interposed between them.

The term on or under with respect to each element may be referenced to the drawings. For the sake of description, the sizes of individual elements in the appended drawings may be exaggeratingly depicted and do not indicate the actual sizes.

In this specification, when a part is referred to as "comprising" an element, it is to be understood that it may comprise other elements as well, rather than excluding the other elements, unless specifically stated otherwise.

In addition, all numerical ranges related to the physical properties, dimensions, and the like of a component used herein are to be understood as being modified by the term "about," unless otherwise indicated.

[Polishing Pad]

The polishing pad according to an embodiment comprises a polishing layer comprising a cured product of a composition comprising a urethane-based prepolymer, a curing agent, and a foaming agent, wherein the content of the oxygen (O) element in the polishing layer is 15% by weight to 19% by weight based on the total weight of the polishing layer, and the total content of the nitrogen (N) and oxygen (O) elements in the polishing layer is 20% by weight to 27% by weight based on the total weight of the polishing layer.

According to an embodiment of the present invention, the polishing rate can be significantly enhanced according to the content of the oxygen (O) element and the total content of the nitrogen (N) and oxygen (O) elements in the polishing layer.

First, the content of the oxygen (O) element in the polishing layer may have an impact on the bonding strength between the polishing pad and the polishing particles and on the bonding strength between the polishing particles and the semiconductor substrate. Thus, the content of the oxygen (O) element in the polishing layer may be adjusted to control the bonding strength between them, thereby enhancing the polishing rate.

The content of the oxygen (O) element in the polishing layer may be 15% by weight to 19% by weight, 16% by weight to 18.9% by weight, 15% by weight to 18% by weight, or 16% by weight to 18% by weight, based on the total weight of the polishing layer. Specifically, if the content of the oxygen (O) element is within the above range, the bonding strength between the polishing particles used during polishing, for example, ceria ($CeO_2$) particles and the polishing pad is appropriately controlled, which, in turn, enhances the bonding strength between the ceria ($CeO_2$)

particles and the semiconductor substrate (or wafer), thereby enhancing the polishing rate. If the content of the oxygen (O) element exceeds 19% by weight, the bonding strength between the ceria ($CeO_2$) particles used during polishing and the polishing pad is excessively increased, which reduces the bonding strength between the ceria ($CeO_2$) particles and the wafer, thereby adversely affecting the polishing rate. On the other hand, if the content of the oxygen (O) element is less than 15% by weight, the bonding strength between the ceria ($CeO_2$) particles and the polishing pad is decreased, which increases the bonding strength with the wafer, resulting in a problem that defects and scratches are increased.

In addition, the total content of the nitrogen (N) and oxygen (O) elements in the polishing layer may be 20% by weight to 27% by weight, 22% by weight to 27% by weight, 23% by weight to 27% by weight, or 22% by weight to 25% by weight, based on the total weight of the polishing layer. Since the total content of the nitrogen (N) and oxygen (O) elements in the polishing layer has an impact on the bonding strength with a semiconductor substrate or a slurry, the polishing rate can be enhanced if the above range is satisfied. If the total content of the nitrogen (N) and oxygen (O) elements in the polishing layer is less than 20% by weight, there may arise a problem that defects and scratches are increased. If it exceeds 27% by weight, there may arise a problem that the polishing rate is reduced.

Meanwhile, the main elements in the polishing layer may include carbon (C), nitrogen (N), oxygen (O), and hydrogen (H) elements. In addition, the main elements in the polishing layer may include carbon (C), nitrogen (N), oxygen (O), hydrogen (H), Si (silicon), and chlorine (Cl) elements. The total content of the main elements in the polishing layer, for example, the total content of the carbon (C), nitrogen (N), oxygen (O), and hydrogen (H) elements may be 90% by weight to 96% by weight based on the total weight of the polishing layer.

The total content of the main elements in the polishing layer, for example, the total content of the carbon (C), nitrogen (N), oxygen (O), and hydrogen (H) elements may be 92% by weight to 96% by weight, 92% by weight to 95.5% by weight, 92% by weight to 94% by weight, or 94% by weight to 96% by weight, based on the total weight of the polishing layer.

The total content of other elements than the main elements, for example, carbon (C), nitrogen (N), oxygen (O) and hydrogen (H) elements, in the polishing layer may be 4% by weight to 8% by weight, 4.5% by weight to 8% by weight, 5% by weight to 7% by weight, 4% by weight to 7% by weight, or 6% by weight to 8% by weight, based on the total weight of the polishing layer.

In addition, the total content of the nitrogen (N), oxygen (O), and hydrogen (H) elements in the polishing layer may be 30% by weight to 35% by weight, 32% by weight to 35% by weight, or 33% by weight to 34% by weight, based on the total content of the main elements in the polishing layer, specifically the total content of the carbon (C), nitrogen (N), oxygen (O), and hydrogen (H) elements in the polishing layer. Since the total content of the nitrogen (N), oxygen (O), and hydrogen (H) elements in the polishing layer has an impact on the bonding strength with a semiconductor substrate or a slurry, the polishing rate can be enhanced if the above range is satisfied.

Meanwhile, the polishing pad according to another embodiment comprises a polishing layer comprising a cured product of a composition comprising a urethane-based prepolymer, a curing agent, and a foaming agent, wherein the content of the nitrogen (N) element in the polishing layer is 7% by weight or more based on the total weight of the polishing layer, and the total content of the nitrogen (N), carbon (C), oxygen (O), and hydrogen (H) elements in the polishing layer is 90% to 96% by weight based on the total weight of the polishing layer.

According to an embodiment of the present invention, the physical properties of the polishing pad can be significantly enhanced by adjusting the content of the nitrogen (N) element, which is one of the main elements in the polishing layer. The content of the nitrogen (N) element in the polishing layer may be 7% by weight or more, for example, 7% by weight to 10% by weight, for example, 7% by weight to 9% by weight, for example, 7% by weight to 8% by weight, for example, 7% by weight to 7.5% by weight, based on the total weight of the polishing layer. If the content of the nitrogen (N) element is within the above range, it is possible to achieve an appropriate level of the physical properties of the polishing pad, in particular, such physical properties as hardness, tensile strength, elongation, and modulus, and to achieve an appropriate level of the polishing performance suitable for polishing a tungsten layer using a silica slurry.

If the content of the nitrogen (N) element in the polishing layer is excessively increased, the hardness of the polishing layer is increased. In such event, the glazing phenomenon in which the pore structure on the surface collapses as the polishing progresses may be increased. This weakens the capability of the pore structure on the surface for carrying a silica slurry. As a result, the polishing rate of a tungsten layer is decreased. Accordingly, the polishing rate of a tungsten layer using a silica slurry can be adjusted to an appropriate level by adjusting the content of the nitrogen (N) element in the polishing layer to an appropriate range.

If the content of the nitrogen (N) element in the polishing layer is less than 7% by weight, the hardness, tensile strength, elongation, and modulus may be decreased, and the initial polishing rate may be rapidly increased. In particular, the polishing rate of a tungsten layer using a fumed silica slurry may be excessively increased, which adversely affects the polishing performance. Meanwhile, if the content of the nitrogen (N) element in the polishing layer is 7% by weight or more, for example, 7% by weight to 10% by weight, for example, 7% by weight to 9% by weight, for example, 7% by weight to 8% by weight, for example, 7% by weight to 7.5% by weight, based on the total weight of the polishing layer, it is possible to achieve an appropriate level of hardness, tensile strength, elongation, and modulus, thereby adjusting the polishing rate of a tungsten layer using a fumed silica slurry to an appropriate level.

In addition, the total content of the nitrogen (N), carbon (C), oxygen (O), and hydrogen (H) elements in the polishing layer has an impact on the polishing rate and the physical properties of the polishing pad. In light thereof, it may be, for example, 90% by weight to 96% by weight, for example, 92% by weight to 96% by weight, for example, 93% by weight to 96% by weight, based on the total weight of the polishing layer. If the total content of the nitrogen (N), carbon (C), oxygen (O), and hydrogen (H) elements in the polishing layer is outside the above range, it may adversely affect the polishing rate and the physical properties.

The content of each element in the polishing layer may be measured by nuclear magnetic resonance (NMR) or element analysis (EA). The content of each element in the polishing layer was measured by subjecting the top pad of the polishing pad to element analysis using an analyzer of model name Flash2000 (Thermo Fisher Scientific, Germany).

According to an embodiment of the present invention, the oxygen (O) element in the polishing layer may be derived from a diisocyanate compound and a polyol employed in the urethane-based prepolymer. In addition, the oxygen (O) element in the polishing layer may be derived from a curing agent.

According to another embodiment of the present invention, the nitrogen (N) element in the polishing layer may be derived from the curing agent and a diisocyanate compound (e.g., an alicyclic diisocyanate compound and an aromatic diisocyanate compound) employed in the urethane-based prepolymer.

The molar ratio of the nitrogen (N) element derived from the diisocyanate compound and the nitrogen (N) element derived from the curing agent may be 2.0 to 2.7:1. Specifically, the molar ratio of the nitrogen (N) element derived from the diisocyanate compound and the nitrogen (N) element derived from the curing agent may be 2.0 to 2.6:1. More specifically, the molar ratio of the nitrogen (N) element derived from the diisocyanate compound and the nitrogen (N) element derived from the curing agent may be, for example, 2.1 to 2.55:1, for example, 2.3 to 2.55:1.

The polishing pad according to still another embodiment of the present invention comprises a polishing layer comprising a cured product of a composition comprising a urethane-based prepolymer, a curing agent, and a foaming agent, wherein the content of the oxygen (O) element in the polishing layer is 15% by weight to 19% by weight based on the total weight of the polishing layer, the content of the nitrogen (N) element in the polishing layer is 7% by weight or more based on the total weight of the polishing layer, the total content of the nitrogen (N) and oxygen (O) elements in the polishing layer is 20% by weight or more based on the total weight of the polishing layer, and the total content of the nitrogen (N), carbon (C), oxygen (O), and hydrogen (H) elements in the polishing layer is 90% by weight or more based on the total weight of the polishing layer.

Specifically, the polishing pad comprises a polishing layer comprising a cured product of a composition comprising a urethane-based prepolymer, a curing agent, and a foaming agent, wherein the content of the oxygen (O) element in the polishing layer is 15% by weight to 19% by weight based on the total weight of the polishing layer, the content of the nitrogen (N) element in the polishing layer is 7% by weight to 10% by weight based on the total weight of the polishing layer, the total content of the nitrogen (N) and oxygen (O) elements in the polishing layer is 20% by weight to 27% by weight based on the total weight of the polishing layer, and the total content of the nitrogen (N), carbon (C), oxygen (O), and hydrogen (H) elements in the polishing layer is 90% by weight to 96% by weight based on the total weight of the polishing layer.

If the polishing pad satisfies the above content range of each element, it is possible to control the bonding strength between the polishing pad and the polishing particles, thereby enhancing the bonding strength between the polishing particles and the semiconductor substrate (or wafer), and it is possible to enhance not only the mechanical properties of the polishing pad such as hardness, tensile strength, elongation, and modulus, but also the polishing rate of both of a tungsten layer or an oxide layer at the same time.

Accordingly, it is possible to efficiently fabricate a semiconductor device of excellent quality using the polishing pad.

Urethane-Based Prepolymer

The urethane-based prepolymer may be an important factor for controlling the content of each of the oxygen (O), hydrogen (H), and nitrogen (N) elements, and the total content thereof.

Specifically, the content of the oxygen (O) element in the polishing layer may vary with the types and contents of the diisocyanate compound and the polyol used in the polymerization of the urethane-based prepolymer.

The content of the nitrogen (N) element in the polishing layer may vary with the type and content of the diisocyanate compound used in the polymerization of the urethane-based prepolymer.

Further, the content of each of the oxygen (O), hydrogen (H), and nitrogen (N) elements in the polishing layer, the total content thereof, and the total content of the nitrogen (N), carbon (C), oxygen (O), and hydrogen (H) elements may vary with the types and contents of the diisocyanate compound and the polyol used in the polymerization of the urethane-based prepolymer.

The urethane-based prepolymer may comprise a prepolymerization reaction product of at least one diisocyanate compound and at least two polyols. The content of the oxygen (O) element in the polishing layer may vary with the types and contents of the diisocyanate compound and the polyol. The oxygen (O) element in the polishing layer may be derived from the diisocyanate compound and the polyol.

The prepolymerization reaction generally refers to a reaction for preparing a polymer having a relatively low molecular weight wherein the degree of polymerization is adjusted to an intermediate level for the sake of conveniently molding a product in the process of producing the molded article of a final polymer. Thus, a prepolymer comprising a prepolymerization reaction product may be molded by itself, or after a further reaction with another polymerizable compound or a curing agent, to form a final product. For example, the weight average molecular weight (Mw) of the urethane-based prepolymer may be 500 g/mole to 3,000 g/mole, 600 g/mole to 2,000 g/mole, or 700 g/mole to 1,500 g/mole.

The at least one diisocyanate compound may be at least one aromatic diisocyanate compound and/or at least one aliphatic diisocyanate compound or alicyclic diisocyanate compound. For example, it may comprise at least one selected from the group consisting of toluene diisocyanate (TDI), naphthalene-1,5-diisocyanate, p-phenylene diisocyanate, tolidine diisocyanate, diphenylmethane diisocyanate (MDI), hexamethylene diisocyanate (HDI), dicyclohexylmethane diisocyanate (H12MDI), and isophorone diisocyanate. Specifically, the diisocyanate compound may be at least one selected from the group consisting of toluene diisocyanate (TDI), diphenylmethane diisocyanate (MDI), hexamethylene diisocyanate (HDI), and dicyclohexylmethane diisocyanate (H12MDI).

Meanwhile, the polyol refers to a compound that comprises two or more hydroxyl groups. The at least two polyols may be at least one single-molecule-type polyol and at least one polymer-type polyol.

The content of each element, specifically the content of the oxygen (O) element, in the polishing layer can be controlled, as well as the gelation time and the physical properties including hardness can be changed, by adjusting the types and contents of the single-molecule-type polyol and the polymer-type polyol. In addition, if the content of the oxygen (O) element in the polishing layer is controlled by using only one of the polyols, it may adversely affect the physical properties, especially hardness, of the polishing pad.

The single-molecule-type polyol may have a weight average molecular weight of 70 g/mole to 200 g/mole, and the polymer-type polyol may have a weight average molecular weight of 300 g/mole to 3,000 g/mole.

The single-molecule-type polyol may comprise at least one selected from the group consisting of ethylene glycol (EG), diethylene glycol (DEG), propylene glycol (PG), propanediol (PDO), and methyl propanediol (MP-diol). Specifically, the single-molecule-type polyol may comprise diethylene glycol (DEG), propylene glycol (PG), or a mixture thereof in view of the gelation time and hardness.

The polymer-type polyol may comprise at least one selected from the group consisting of a polytetramethylene glycol (PTMG), a polytetramethylene ether glycol (PT-MEG), a polyether polyol, a polyester polyol, a polycarbonate polyol, and a polycaprolactone polyol. Specifically, the polymer-type polyol may be at least one selected from the group consisting of a polytetramethylene glycol (PTMG) and a polytetramethylene ether glycol (PTMEG) in view of the gelation time and hardness.

The molar ratio of the oxygen (O) element derived from the polyol and the oxygen (O) element derived from the diisocyanate compound may be, for example, 1:0.1 to 0.5, for example 1:0.1 to 0.4.

The mixed weight ratio of the diisocyanate compound and the polyol may be, for example, 1:1.35 to 1.55, for example, 1:1.35 to 1.53, for example, 1:1.40 to 1.50.

The mixed weight ratio of the single-molecule-type polyol and the polymer-type polyol may be, for example, 1:8 to 10, for example, 1:8.5 to 9.8, for example, 1:8.5 to 9.6. If the mixed weight ratio of the single-molecule-type polyol and the polymer-type polyol is within the above range, the hardness desired in the present invention can be achieved. If the mixed weight ratio is outside the above range, the hardness may be excessively increased or decreased.

In addition, the mixed weight ratio of the diisocyanate compound and the polymer-type polyol may be 1:1.2 to 1.43, for example, 1:1.25 to 1.43, for example, 1:1.25 to 1.35.

Meanwhile, the mixed weight ratio of the diisocyanate compound and the single-molecule-type polyol may be 1:0.11 to 0.15, for example, 1:0.12 to 0.14, for example, 1:0.13 to 0.14.

According to an embodiment of the present invention, the polishing pad may satisfy at least one of the mixed weight ratio of the diisocyanate compound and the polyol of 1:1.35 to 1.55, the mixed weight ratio of the single-molecule-type polyol and the polymer-type polyol of 1:8 to 10, the mixed weight ratio of the diisocyanate compound and the polymer-type polyol of 1:1.2 to 1.43, and the mixed weight ratio of the diisocyanate compound and the single-molecule-type polyol of 1:0.11 to 0.15.

The content of the diisocyanate compound may be 29.9% by weight to 35% by weight based on the total weight of the composition (i.e., the composition for preparing a polishing pad). Specifically, the content of the diisocyanate compound may be 30% by weight to 34% by weight, 30% by weight to 33% by weight, 32% by weight to 34% by weight, or 31% by weight to 33% by weight, based on the total weight of the composition. If the content of the diisocyanate compound exceeds the above range, the total content of the nitrogen (N) and oxygen (O) elements in the polishing layer is excessively increased, which may adversely affect the polishing rate. If it is less than the above range, the total content of the nitrogen (N) and oxygen (O) elements in the polishing layer is excessively decreased, which may result in an increase in defects and scratches.

The content of the at least two polyols may be, for example, 42% by weight to 47% by weight, for example, 44% by weight to 47% by weight, based on the total weight of the composition (i.e., the composition for preparing a polishing pad).

The content of the polymer-type polyol may be 35% by weight to 42.8% by weight, 38% by weight to 42% by weight, 39% by weight to 42% by weight, or 40% by weight to 42% by weight, based on the total weight of the composition (i.e., the composition for preparing a polishing pad). If the content of the polymer-type polyol is less than the above range, the content of the oxygen (O) element in the polishing layer may be decreased, thereby adversely affecting the polishing rate and the number of defects.

The content of the single-molecule-type polyol may be, for example, 4.0% by weight to 4.5% by weight, for example, 4.1% by weight to 4.5% by weight, for example, 4.2% by weight to 4.4% by weight, based on the total weight of the composition (i.e., the composition for preparing a polishing pad). If the content of the single-molecule-type polyol is less than the above range, the content of the oxygen (O) element in the polishing layer may be decreased, thereby adversely affecting the polishing rate and the number of defects.

According to still another embodiment of the present invention, the urethane-based prepolymer may comprise a prepolymerization reaction product of at least two diisocyanate compounds and at least one polyol. The at least two diisocyanate compounds may comprise at least one alicyclic diisocyanate compound and at least one aromatic diisocyanate compound.

According to an embodiment of the present invention, the content of the nitrogen (N) element in the polishing, and/or the total content of the nitrogen (N), carbon (C), oxygen (O), and hydrogen (H) elements in the polishing, may vary with the types and contents of the alicyclic diisocyanate compound and the aromatic diisocyanate compound.

The alicyclic diisocyanate compound may comprise at least one selected from the group consisting of 4,4'-dicyclohexylmethane diisocyanate (H12MDI), isophorone diisocyanate (IPDI), and 1,4-cyclohexylmethane diisocyanate (CHDI). Specifically, the alicyclic diisocyanate compound may comprise 4,4'-dicyclohexylmethane diisocyanate (H12MDI) in view of the content of the nitrogen (N) element in the polishing layer, the unreacted NCO group, and the physical properties of the polishing pad.

In addition, the aromatic diisocyanate compound may comprise at least one selected from the group consisting of 4,4'-diphenylmethane diisocyanate (MDI), toluene diisocyanate (TDI), carbodiimide-modified 4,4'-diphenylmethane diisocyanate, and polymeric 4,4'-diphenylmethane diisocyanate. Specifically, the aromatic diisocyanate compound may comprise toluene diisocyanate (TDI), specifically at least one selected from the group consisting of toluene 2,4-diisocyanate and toluene 2,6-diisocyanate, in view of the content of the nitrogen (N) element in the polishing layer, the unreacted NCO group, and the physical properties of the polishing pad.

According to an embodiment of the present invention, the molar ratio of the nitrogen (N) element derived from the alicyclic diisocyanate compound and the nitrogen (N) element derived from the aromatic diisocyanate compound may be, for example, 0.05 to 0.082:1, for example, 0.06 to 0.082:1, for example, 0.07 to 0.08:1.

In addition, the mixed weight ratio of the alicyclic diisocyanate compound and the aromatic diisocyanate compound may be, for example, 1:7 to 10, for example, 1:8 to 10, for example, 1:8.1 to 10, for example, 1:8.2 to 9.8.

The content of the alicyclic diisocyanate compound may be 2.5% by weight to 3.30% by weight based on the total weight of the composition (i.e., the composition for preparing a polishing pad). Specifically, the content of the alicyclic diisocyanate compound may be, for example, 2.8% by weight to 3.30% by weight, for example, 3.0% by weight to 3.30% by weight, for example, 3.20% by weight to 3.30% by weight, based on the total weight of the composition.

If an alicyclic diisocyanate compound that satisfies the above content range is employed, the gelation time or hardness can be appropriately adjusted, which may have an advantageous impact on the polishing performance. In addition, if the content of the alicyclic diisocyanate compound exceeds the above range, whereby the total content of the diisocyanate compound is increased, there may arise a problem that the gelation time or hardness is increased. On the other hand, if the content of the alicyclic diisocyanate compound is less than the above range, whereby the total content of the diisocyanate compound is decreased, there may arise a problem that the gelation time or hardness is decreased.

The content of the aromatic diisocyanate compound may be 26.7% by weight to 30.0% by weight based on the total weight of the composition (i.e., the composition for preparing a polishing pad). Specifically, the content of the aromatic diisocyanate compound may be, for example, 26.8% by weight to 30.0% by weight, for example, 26.8% by weight to 29.0% by weight, for example, 26.9% by weight to 29.0% by weight, based on the total weight of the composition. If the content of the aromatic diisocyanate compound exceeds the above range, there may arise a problem that the gelation time or hardness is increased. If it is less than the above range, there may arise a problem that the gelation time or hardness is decreased.

Meanwhile, the polyol refers to a compound that comprises two or more hydroxyl groups. It may comprise a single-molecule-type polyol and a polymer-type polyol. Examples of the single-molecule-type polyol include ethylene glycol (EG), diethylene glycol (DEG), propylene glycol (PG), propanediol (PDO), and methyl propanediol (MP-diol). Examples of the polymer-type polyol include a polytetramethylene glycol (PTMG), a polytetramethylene ether glycol (PTMEG), a polyether polyol, a polyester polyol, a polycarbonate polyol, and a polycaprolactone polyol. The polymer-type polyol may have a weight average molecular weight of 300 g/mole to 3,000 g/mole.

The content of the polyol may be, for example, 40% by weight to 55% by weight, for example, 42% by weight to 50% by weight, for example, 45% by weight to 50% by weight, based on the total weight of the composition (i.e., the composition for preparing a polishing pad).

The urethane-based prepolymer may comprise 8% by weight to 12% by weight of diisocyanate compound end groups. Specifically, the urethane-based prepolymer may comprise 8% by weight to 10% by weight of diisocyanate compound end groups.

Process for Preparing a Urethane-Based Prepolymer

The urethane-based prepolymer may be prepared by a prepolymerization reaction of at least one diisocyanate compound and at least two polyols as described above.

Alternatively, the urethane-based prepolymer may be prepared by a prepolymerization reaction of at least two diisocyanate compounds and at least one polyol as described above.

The content of each element in the polishing layer, specifically the content of each of the oxygen (O), hydrogen (H), and nitrogen (N) elements, or the total content thereof can be controlled by adjusting the types and contents of the respective diisocyanate compounds and polyols employed in this process.

In addition, the content of each diisocyanate and polyol added in this process and the reaction conditions may be adjusted to control the content of each type of diisocyanate compound and the extent of reaction or unreaction thereof. In particular, the content of the nitrogen (N) element in the polishing layer and/or the total content of the nitrogen (N), carbon (C), oxygen (O), and hydrogen (H) elements can be controlled by adjusting the types and contents of the diisocyanate compounds and the polyols.

The content of each type of diisocyanate compound in the urethane-based prepolymer and the extent of reaction or unreaction thereof may be measured by NMR equipment. Once it is confirmed that the prepolymerization reaction has been carried out to a desired extent, the reaction conditions may be changed to prepare a urethane-based prepolymer, if necessary.

In addition, additional monomers such as diisocyanate compounds or alcohols, or other additives, may be further added to the prepolymerization reaction.

Curing Agent

The curing agent may be an important factor for controlling the content of the oxygen (O) element and/or the content of the nitrogen (N) element. That is, the content of the oxygen (O) element and/or the content of the nitrogen (N) element in the polishing layer may vary with the type and content of the curing agent. For example, the content of the oxygen (O) element may vary if an alcohol-based amine curing agent is used, and the content of the nitrogen (N) element may vary if a curing agent containing nitrogen (N) is used.

The curing agent may comprise a curing agent containing nitrogen (N). For example, it may comprise at least one selected from the group consisting of 4,4'-methylenebis(2-chloroaniline) (MOCA), diethyltoluenediamine (DETDA), diaminodiphenylmethane, diaminodiphenyl sulphone, m-xylylenediamine, isophoronediamine, ethylenediamine, diethylenetriamine, triethylenetetramine, polypropylenediamine, polypropylenetriamine, and bis(4-amino-3-chlorophenyl)methane. Specifically, the curing agent may comprise 4,4'-methylenebis(2-chloroaniline) (MOCA).

The content of the curing agent may be an important factor for enhancing the physical properties and polishing rate of the polishing pad of the present invention.

The content of the curing agent may be 16.0% by weight to 22% by weight based on the total weight of the composition.

Specifically, the content of the curing agent may be 16.0% by weight to 20% by weight, 17.0% by weight to 19.3% by weight, 17.0% by weight to 19.0% by weight, or 18.0% by weight to 19.3% by weight, based on the total weight of the composition.

Alternatively, the content of the curing agent may be 17.0% by weight to 22.0% by weight, 18.0% by weight to 22.0% by weight, 18.0% by weight to 21.0% by weight, or 17.0% by weight to 19.0% by weight, based on the total weight of the composition.

If a curing agent within the above range is employed, it is possible to enhance the physical properties of the polishing pad such as hardness, tensile strength, elongation, and modulus. In addition, if the content of the curing agent is excessively small, the content of the oxygen (O) and nitrogen (N) elements in the polishing layer may fall outside the range of the present invention.

Meanwhile, the diisocyanate compound and the curing agent in the urethane-based prepolymer may be mixed at a molar equivalent ratio of 1:0.8 to 1:1.2, or a molar equivalent ratio of 1:0.9 to 1:1.1, based on the number of moles of the reactive groups in each molecule. Here, "the number of moles of the reactive groups in each molecule" refers to, for example, the number of moles of the diisocyanate compound end group in the urethane-based prepolymer and the number of moles of the reactive groups (e.g., amine group) in the curing agent. Thus, the molar equivalent ratio of the diisocyanate compound end group of the urethane-based prepolymer and the amine group of the curing agent may be 1:0.8 to 1.2. The urethane-based prepolymer and the curing agent may be fed at a constant rate during the mixing process by controlling the feeding rate such that the urethane-based prepolymer and the curing agent are fed in amounts per unit time that satisfies the molar equivalent ratio exemplified above.

Foaming Agent

The foaming agent is not particularly limited as long as it is commonly used for forming voids in a polishing pad.

For example, the foaming agent may be at least one selected from a solid phase foaming agent having a hollow structure, a liquid phase foaming agent using a volatile liquid, and an inert gas.

The solid phase foaming agent may be thermally expanded microcapsules. They may be obtained by thermally expanding thermally expandable microcapsules. Since the thermally expanded microcapsules in a structure of already expanded micro-balloons have a uniform particle diameter, they have the advantage that the diameter of pores can be uniformly controlled. Specifically, the solid phase foaming agent may be in a structure of micro-balloons having an average particle diameter of 5 μm to 200 μm.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic-based copolymer. Furthermore, the foaming agent may be at least one selected from the group consisting of hydrocarbons having 1 to 7 carbon atoms.

The solid phase foaming agent may be employed in an amount of 0.1% by weight to 2.0% by weight based on the total weight of the composition. Specifically, the solid phase foaming agent may be employed in an amount of 0.5% by weight to 1.5% by weight, 0.5% by weight to 1.0% by weight, or 0.8% by weight to 1.4% by weight, based on the total weight of the composition.

The kind of the inert gas is not particularly limited as long as it is a gas that does not participate in the reaction between the urethane-based prepolymer and the epoxy curing agent. For example, the inert gas may be at least one selected from the group consisting of nitrogen gas ($N_2$), carbon dioxide gas ($CO_2$), argon gas (Ar), and helium gas (He). Specifically, the inert gas may be nitrogen gas ($N_2$) or carbon dioxide gas ($CO_2$).

The inert gas may be fed in a volume of 10% to 30% based on the total volume of the composition. Specifically, the inert gas may be fed in a volume of 15% to 30% based on the total volume of the composition.

Other Additives

According to an embodiment of the present invention, the composition may further comprise an additive that comprises a surfactant.

The surfactant may act to prevent the pores to be formed from overlapping and coalescing with each other. Specifically, the surfactant is preferably a silicone-based nonionic surfactant. But other surfactants may be variously selected depending on the physical properties required for the polishing pad.

As the silicone-based nonionic surfactant, a silicone-based nonionic surfactant having a hydroxyl group may be used alone or in combination with a silicone-based nonionic surfactant having no hydroxyl group.

The silicone-based nonionic surfactant having a hydroxyl group is not particularly limited as long as it is widely used in the polyurethane technology industry since it is excellent in compatibility with an isocyanate-containing compound and an active hydrogen compound. Examples of the silicone-based nonionic surfactant having a hydroxyl group, which is commercially available, include DOW CORNING 193 (a silicone glycol copolymer in a liquid phase having a specific gravity at 25° C. of 1.07, a viscosity at 20° C. of 465 $mm^2$/s, and a flash point of 92° C.) (hereinafter referred to as DC-193) manufactured by Dow Corning.

Examples of the silicone-based nonionic surfactant having no hydroxyl group, which is commercially available, include DOW CORNING 190 (a silicone glycol copolymer having a Gardner color number of 2, a specific gravity at 25° C. of 1.037, a viscosity at 25° C. of 2,000 $mm^2$/s, a flash point of 63° C. or higher, and an inverse solubility point (1.0% water solution) of 36° C. (hereinafter referred to as DC-190) manufactured by Dow Corning.

The surfactant may be employed in an amount of 0.1 to 2% by weight based on the total weight of the composition. Specifically, the surfactant may be employed in an amount of 0.2 to 1.8% by weight, 0.2 to 1.6% by weight, 0.2 to 1.5% by weight, 0.2 to 1.0% by weight, 0.1 to 0.5% by weight, 0.2 to 0.8% by weight, 0.2 to 0.7% by weight, or 0.2 to 0.6% by weight, based on the total weight of the composition. If the amount of the surfactant is within the above range, pores derived from the gas phase foaming agent can be stably formed and maintained in the mold.

According to an embodiment of the present invention, the composition may further comprise other additive compounds than the substances described above. Various additive compounds commonly used may be added as long as they do not adversely affect the purpose of the present invention.

The additive compounds may be employed in an amount of 0.2% by weight to 4.0% by weight, 0.5% by weight to 3.8% by weight, 0.8% by weight to 3.5% by weight, 1.0% by weight to 3.5% by weight, 0.8% by weight to 2.5% by weight, or 2.5% by weight to 3.5% by weight, based on the total weight of the composition.

For example, the additive compound may comprise one selected from the group consisting of a reaction rate controlling agent, a chain extender, a catalyst, an additional curing agent other than the above curing agent, and combinations thereof.

According to an embodiment the present invention, the content of the diisocyanate compound may be 30% by weight to 34% by weight, the content of the polymer-type polyol may be 38% by weight to 42% by weight, and the content of the single-molecule-type polyol may be 4.1% by weight to 4.5% by weight, based on the total weight of the composition.

According to an embodiment the present invention, the content of the diisocyanate compound may be 30% by weight to 34% by weight, the content of the polymer-type polyol may be 38% by weight to 42% by weight, the content of the single-molecule-type polyol may be 4.1% by weight to 4.5% by weight, and the content of the curing agent may be 17.0% by weight to 19.3% by weight, based on the total weight of the composition. If the contents of the above respective components satisfy the above ranges, it is possible to achieve the content of the oxygen (O) element in the polishing layer and the total content of the nitrogen (N) and oxygen (O) elements in the polishing layer as desired in the present invention.

According to another embodiment the present invention, the polishing pad may have a content of the alicyclic diisocyanate compound of 2.5% by weight to 3.30% by weight, a content of the aromatic diisocyanate compound of 26.70% by weight to 30.0% by weight, and a content of the curing agent of 17.0% by weight to 22.0% by weight, based on the total weight of the composition.

Specifically, the polishing pad may have a content of the alicyclic diisocyanate compound of 2.80% by weight to 3.30% by weight, a content of the aromatic diisocyanate compound of 26.80% by weight to 30.0% by weight, and a content of the curing agent of 18.0% by weight to 22.0% by weight, based on the total weight of the composition.

According to an embodiment of the present invention, the nitrogen (N) element in the polishing layer may be derived from the curing agent, the alicyclic diisocyanate compound, and the aromatic diisocyanate compound.

For example, the nitrogen (N) element in the polishing layer may be derived from 4,4'-dicyclohexylmethane diisocyanate (H12MDI), toluene diisocyanate (TDI), and 4,4'-methylenebis(2-chloroaniline)(MOCA).

In addition, the total content of the nitrogen (N), carbon (C), oxygen (O), and hydrogen (H) elements in the polishing layer may be derived from the curing agent, the alicyclic diisocyanate compound, and the aromatic diisocyanate compound.

[Process for Preparing a Polishing Pad]

The process for preparing a polishing pad according to an embodiment may comprise sequentially or simultaneously mixing a urethane-based prepolymer, a curing agent, and a foaming agent to prepare a composition; and injecting the composition into a mold and curing it to form a polishing layer.

Specifically, according to an embodiment of the present invention, it comprises sequentially or simultaneously mixing a urethane-based prepolymer, a curing agent, and a foaming agent to prepare a composition; and injecting the composition into a mold and curing it to form a polishing layer, wherein the content of the oxygen (O) element in the polishing layer is 15% by weight to 19% by weight based on the total weight of the polishing layer, and the total content of the nitrogen (N) and oxygen (O) elements in the polishing layer is 20% by weight to 27% by weight based on the total weight of the polishing layer.

The process for preparing a polishing pad according to another embodiment comprises sequentially or simultaneously mixing a urethane-based prepolymer, a curing agent, and a foaming agent to prepare a composition; and injecting the composition into a mold and curing it to form a polishing layer, wherein the content of the nitrogen (N) element in the polishing layer is 7% by weight or more based on the total weight of the polishing layer, and the total content of the nitrogen (N), carbon (C), oxygen (O), and hydrogen (H) elements in the polishing layer is 90% to 96% by weight based on the total weight of the polishing layer.

According to an embodiment of the present invention, the details on the content, type, ratio, and the like of the respective components in the process for preparing a polishing pad are as described above with respect to the polishing pad.

In addition, the step of preparing a composition (i.e., a raw material composition) may comprise preparing a first composition comprising a urethane-based prepolymer; preparing a second composition comprising a curing agent; preparing a third composition comprising a foaming agent; and sequentially or simultaneously mixing the first composition with the second composition and the third composition to prepare the raw material composition.

In addition, the composition may further comprise a surfactant, if desired. The type and content of the surfactant are as described above.

In addition, if desired, when the composition is prepared, at least one foaming agent selected from a liquid phase foaming agent using a volatile liquid and a gas phase foaming agent such as an inert gas may be further mixed.

The mixing may be carried out by mixing the first composition with the second composition, followed by further mixing thereof with the third composition, or by mixing the first composition with the third composition, followed by further mixing thereof with the second composition.

As an example, the urethane-based prepolymer, the curing agent, and the foaming agent may be put into the mixing process substantially at the same time. If the foaming agent, the surfactant, and the inert gas are further added, they may be put into the mixing process substantially at the same time.

As another example, the urethane-based prepolymer, the foaming agent, and the surfactant may be mixed in advance, and the curing agent, or the curing agent and the inert gas, may be subsequently introduced.

The mixing may be carried out at a speed of 1,000 to 10,000 rpm or 4,000 to 7,000 rpm. Within the above speed range, it may be more advantageous for the inert gas and the foaming agent to be uniformly dispersed in the composition.

In addition, the step of preparing the composition may be carried out under the condition of 50° C. to 150° C. If necessary, it may be carried out under vacuum defoaming conditions.

The step of injecting the composition into a mold and curing it to form a polishing layer may be carried out under the temperature condition of 60° C. to 120° C. and the pressure condition of 50 kg/m$^2$ to 200 kg/m$^2$.

In addition, the above preparation process may further comprise the steps of cutting the surface of a polishing pad thus obtained, machining grooves on the surface thereof, bonding with the lower part, inspection, packaging, and the like. These steps may be carried out in a conventional manner for preparing a polishing pad.

[Physical Properties of the Polishing Pad]

The polishing pad according to an embodiment of the present invention can enhance the physical properties and polishing rate.

Specifically, the average thickness of the polishing layer may be 0.8 mm to 5.0 mm, 1.0 mm to 4.0 mm, 1.0 mm to 3.0 mm, 1.5 mm to 2.5 mm, 1.7 mm to 2.3 mm, or 2.0 mm to 2.1 mm. Within the above range, the basic physical properties as a polishing layer can be sufficiently achieved while the pore size variation between the upper and lower portions is minimized.

The specific gravity of the polishing layer may be 0.6 g/cm$^3$ to 0.9 g/cm$^3$ or 0.7 g/cm$^3$ to 0.85 g/cm$^3$.

The hardness of the polishing layer may be 45 Shore D to 80 Shore D, 45 Shore D to 70 Shore D, 45 Shore D to 60 Shore D, 50 Shore D to 60 Shore D, or 55 Shore D to 60 Shore D.

The tensile strength of the polishing layer may be 16 N/mm$^2$ to 25 N/mm$^2$, 18 N/mm$^2$ to 25 N/mm$^2$, 20 N/mm$^2$ to 25 N/mm$^2$, or 20 N/mm$^2$ to 24 N/mm$^2$.

The elongation of the polishing layer may be 95% to 200%, 98% to 200%, 100% to 150%, or 100% to 120%.

The modulus of the polishing pad may be 50 kgf/cm$^2$ to 130 kgf/cm$^2$, 50 kgf/cm$^2$ to 125 kgf/cm$^2$, 55 kgf/cm$^2$ to 125 kgf/cm$^2$, or 60 kgf/cm$^2$ to 120 kgf/cm$^2$.

In addition, the polishing pad comprises micropores.

The micropores may be contained in the number of 100 to 300, 150 to 300, or 100 to 250 per an area of 0.3 cm$^2$ of the polishing layer.

The number average diameter of the micropores may be 10 μm to 50 μm, 20 μm to 50 μm, 20 μm to 40 μm, 20 μm to 30 μm, or 30 μm to 50 μm. As a specific example, the micropores may have a number average diameter of 20 μm to 25 μm.

In addition, the total area of the micropores may be 30% to 60%, 35% to 50%, or 40% to 50% based on the total area of the polishing layer.

In addition, the micropores may be contained in an amount of 30 to 70% by volume, or 40 to 60% by volume, based on the total volume of the polishing layer.

The polishing layer may have grooves on its surface for mechanical polishing. The grooves may have a depth, a width, and a spacing as desired for mechanical polishing, which are not particularly limited.

The polishing pad may further comprise a support layer laminated with the polishing layer. The support layer serves to support the polishing layer and to absorb and disperse an impact applied to the polishing layer. The support layer may comprise a nonwoven fabric or a suede. It may have a thickness of 0.5 mm to 1 mm and a hardness of 60 Asker C to 90 Asker C.

In addition, an adhesive layer may be interposed between the polishing layer and the support layer. The adhesive layer may comprise a hot melt adhesive. The hot melt adhesive may be at least one selected from the group consisting of a polyurethane resin, a polyester resin, an ethylene-vinyl acetate resin, a polyamide resin, and a polyolefin resin. Specifically, the hot melt adhesive may be at least one selected from the group consisting of a polyurethane resin and a polyester resin.

The polishing rate (or removal rate) of the polishing pad, for example, the polishing rate for an oxide (O) layer using a ceria slurry may be 3,000 Å/min to 4,000 Å/min, 3,200 Å/min to 4,000 Å/min, 3,500 Å/min to 4,000 Å/min, or 3,700 Å/min to 4,000 Å/min. The polishing rate may be an initial polishing rate immediately after the preparation of the polishing pad (i.e., immediately after the curing).

The polishing rate (or removal rate) of the polishing pad, for example, the polishing rate for a tungsten (W) layer using a fumed silica slurry may be 400 Å/min to 650 Å/min, 400 Å/min to 630 Å/min, 400 Å/min to 600 Å/min, or 400 Å/min to 590 Å/min. The polishing rate may be an initial polishing rate immediately after the preparation of the polishing pad (i.e., immediately after the curing).

In addition, the pad cut rate of the polishing pad may be 15 μm/hr to 45 μm/hr, 20 μm/hr to 35 μm/hr, 25 μm/hr to 45 μm/hr, or 25 μm/hr to 35 μm/hr.

According to an embodiment of the present invention, if the content of the oxygen (O) element in the polishing layer is 15% by weight to 19% by weight based on the total weight of the polishing layer, and the total content of the nitrogen (N) and oxygen (O) elements in the polishing layer is 20% by weight to 27% by weight based on the total weight of the polishing layer, the bonding strength between the polishing particles, for example, ceria (CeO$_2$) particles and the polishing pad becomes appropriate, which, in turn, enhances the bonding strength between the ceria particles and the semiconductor substrate (or wafer), thereby enhancing the polishing rate.

According to another embodiment of the present invention, if the content of the nitrogen (N) element in the polishing layer is 7% by weight or more based on the total weight of the polishing layer, and the total content of the nitrogen (N), carbon (C), oxygen (O), and hydrogen (H) elements in the polishing layer is 90% to 96% by weight based on the total weight of the polishing layer, it is possible to enhance the hardness, tensile strength, elongation, and modulus. In particular, as the content of the nitrogen (N) element increases, these physical properties can be enhanced together.

In addition, if the polishing pad has physical properties falling within the above ranges, the polishing rate and pad cut rate thereof may be controlled while it has a hardness suitable for a hard pad. Thus, it is possible to efficiently fabricate semiconductor devices of high quality using the polishing pad.

In addition, if the content of the oxygen (O) element, the content of the nitrogen (N) element, the total content of the nitrogen (N) and oxygen (O) elements, and the total content of the nitrogen (N), carbon (C), oxygen (O), and hydrogen (H) elements in the polishing layer are all satisfied, it is possible to control the bonding strength between the polishing pad and the polishing particles, thereby enhancing the bonding strength between the polishing particles and the semiconductor substrate (or wafer), and it is possible to enhance not only the mechanical properties of the polishing pad such as hardness, tensile strength, elongation, and modulus, but also the polishing rate for both a tungsten layer or an oxide layer.

[Process for Preparing a Semiconductor Device]

The process for preparing a semiconductor device according to an embodiment comprises polishing the surface of a semiconductor substrate using the polishing pad according to the embodiment.

Specifically, the process for preparing a semiconductor device comprises mounting a polishing pad comprising a polishing layer on a platen; and relatively rotating the polishing surface of the polishing layer and the surface of a semiconductor substrate while they are in contact with each other to polish the surface of the semiconductor substrate, wherein the polishing pad may be the polishing pad according to the embodiment.

The process for preparing a semiconductor device may comprise mounting a polishing pad comprising a polishing layer on a platen; and relatively rotating the polishing surface of the polishing layer and the surface of a wafer while they are in contact with each other to polish the surface of the semiconductor substrate.

FIG. 5 schematically illustrates the process for preparing a semiconductor device according to an embodiment. Referring to FIG. 5, once the polishing pad (210) according to an embodiment is attached to a platen (220), a semiconductor substrate (230) is disposed on the polishing pad (210). In such event, the surface of the semiconductor substrate (230) is in direct contact with the polishing surface of the polishing pad (210). A polishing slurry (250) may be sprayed through a nozzle (240) on the polishing pad for polishing. The flow rate of the polishing slurry (250) supplied through the nozzle (240) may be selected according to the purpose within a range of about 10 cm³/min to about 1,000 cm³/min. For example, it may be about 50 cm³/min to about 500 cm³/min, but it is not limited thereto.

Thereafter, the semiconductor substrate (230) and the polishing pad (210) rotate relatively to each other, so that the surface of the semiconductor substrate (230) is polished. In such event, the rotation direction of the semiconductor substrate (230) and the rotation direction of the polishing pad (210) may be the same direction or opposite directions. The rotation speeds of the semiconductor substrate (230) and the polishing pad (210) may be selected according to the purpose within a range of about 10 rpm to about 500 rpm. For example, it may be about 30 rpm to about 200 rpm, but it is not limited thereto.

The semiconductor substrate (230) mounted on the polishing head (260) is pressed against the polishing surface of the polishing pad (210) at a predetermined load to be in contact therewith, the surface thereof may then be polished. The load applied to the polishing surface of the polishing pad (210) through the surface of the semiconductor substrate (230) by the polishing head (260) may be selected according to the purpose within a range of about 1 gf/cm² to about 1,000 gf/cm². For example, it may be about 10 gf/cm² to about 800 gf/cm², but it is not limited thereto.

In an embodiment, in order to maintain the polishing surface of the polishing pad (210) in a state suitable for polishing, the process for preparing a semiconductor device may further comprise processing the polishing surface of the polishing pad (210) with a conditioner (270) simultaneously with polishing the semiconductor substrate (230).

In the polishing pad according to an embodiment, the content of the oxygen (O) element, the content of the nitrogen (N) element, the total content of the nitrogen (N) and oxygen (O) elements, and the total content of the nitrogen (N), oxygen (O), and hydrogen (H) elements in the polishing layer are adjusted, thereby enhancing the polishing rate. Thus, it is possible to efficiently fabricate a semiconductor device of excellent quality using the polishing pad.

In the polishing pad according to another embodiment, the content of the nitrogen (N) element and the total content of the nitrogen (N), carbon (C), oxygen (O), and hydrogen (H) elements in the polishing layer are adjusted, thereby enhancing the polishing rate, as well as the physical properties of the polishing pad. Thus, it is possible to efficiently fabricate a semiconductor device of excellent quality using the polishing pad.

EMBODIMENTS FOR CARRYING OUT THE INVENTION

Hereinafter, the present invention will be described in detail with reference to examples. These examples are set forth to illustrate the present invention, and the scope of the present invention is not limited thereto.

Example 1-1

(1) Preparation of a Urethane-Based Prepolymer

A four-necked flask was charged with a diisocyanate compound, polytetramethylene glycol (PTMG) as a polymer-type polyol and diethylene glycol (DEG) as a single-molecule-type polyol, which mixture was reacted at 80° C. for 2 hours to prepare a urethane-based prepolymer. The contents of the diisocyanate compound and the polyols are shown in Table 1-1.

(2) Preparation of a Polishing Pad

A casting machine equipped with tanks and feeding lines for the raw materials such as a urethane-based prepolymer, a curing agent, and a foaming agent was provided. The urethane-based prepolymer prepared above, 4,4'-methylen-ebis(2-chloroaniline) (MOCA, Ishihara) as a curing agent, and a solid phase foaming agent (Akzonobel) were charged to each tank. The raw materials were stirred while they were fed to the mixing head at constant rates through the respective feeding lines. In such event, the prepolymer and the curing agent were fed at an equivalent ratio of 1:1.

The mixed raw materials were injected into a mold (1,000 mm×1,000 mm×3 mm) at a charge rate of 10 kg/min and cast at about 120° C. to obtain a molded article. Thereafter, the top and bottom of the molded article were each ground by a thickness of 0.5 mm to obtain a polishing layer having a thickness to 2 mm.

Thereafter, the polishing layer was subjected to surface milling and groove forming steps and laminated with a support layer by a hot melt adhesive to prepare a polishing pad.

Examples 1-2 to 1-4

The same procedures as in Example 1-1 were carried out to obtain a polishing pad except that the contents of the respective components were changed as shown in Table 1-1 below.

Example 2-1

(1) Preparation of a Urethane-Based Prepolymer

A four-necked flask was charged with toluene 2,4-diisocyanate (2,4-TDI) as an aromatic diisocyanate compound, 4,4'-dicyclohexylmethane diisocyanate (H12MDI) as an alicyclic diisocyanate compound, and diethylene glycol (DEG) as a polyol, which mixture was reacted at 80° C. for 2 hours to prepare a urethane-based prepolymer. The contents of the aromatic diisocyanate compound, the alicyclic diisocyanate compound, and the polyol are shown in Table 2-1.

(2) Preparation of a Polishing Pad

A casting machine equipped with tanks and feeding lines for the raw materials such as a urethane-based prepolymer, a curing agent, and a foaming agent was provided. The urethane-based prepolymer prepared above, 4,4'-methylen-ebis(2-chloroaniline) (MOCA, Ishihara) as a curing agent, and a solid phase foaming agent (Akzonobel) were charged to each tank. The raw materials were stirred while they were fed to the mixing head at constant rates through the respective feeding lines. In such event, the prepolymer and the curing agent were fed at an equivalent ratio of 1:1.

The mixed raw materials were injected into a mold (1,000 mm×1,000 mm×3 mm) at a charge rate of 10 kg/min and cast at about 120° C. to obtain a molded article. Thereafter, the top and bottom of the molded article were each ground by a thickness of 0.5 mm to obtain a polishing layer having a thickness to 2 mm.

Thereafter, the polishing layer was subjected to surface milling and groove forming steps and laminated with a support layer by a hot melt adhesive to prepare a polishing pad.

Examples 2-2 and 2-3

The same procedures as in Example 2-1 were carried out to obtain a polishing pad except that an inert gas (N₂) was injected as a gas phase foaming agent at an injection rate of 1 liter/min and a silicone-based surfactant (Evonik) was added to the urethane-based prepolymer and that the contents of toluene 2,4-diisocyanate (2,4-TDI) as an aromatic diisocyanate compound, 4,4'-dicyclohexylmethane diisocyanate (H12MDI) as an alicyclic diisocyanate compound, diethylene glycol (DEG) as a polyol, and 4,4'-methylenebis(2-chloroaniline) (MOCA) as a curing agent were changed as shown in Table 2-1 below.

Comparative Examples 1-1 to 1-3

The same procedures as in Example 1-1 were carried out to obtain a polishing pad except that the contents of the respective components were changed as shown in Table 1-1 below.

Comparative Example 2-1

The same procedures as in Example 2-1 were carried out to obtain a polishing pad except that the contents of toluene 2,4-diisocyanate (2,4-TDI) as an aromatic diisocyanate compound, 4,4'-dicyclohexylmethane diisocyanate (H12MDI) as an alicyclic diisocyanate compound, diethylene glycol (DEG) as a polyol, and 4,4'-methylenebis(2-chloroaniline) (MOCA) as a curing agent were changed as shown in Table 2-1 below.

Specific process conditions for preparing the polishing layer and the contents of the respective components are summarized in Tables 1-1 and 1-2 below. The weight percentage of each component is calculated based on the total weight of the composition for preparing a polishing pad (100% by weight).

TABLE 1-1

|  | Example | | | | Comparative Example | | |
|---|---|---|---|---|---|---|---|
|  | 1-1 | 1-2 | 1-3 | 1-4 | 1-1 | 1-2 | 1-3 |
| Casting mold | Single layer | Single layer | Single layer | Single layer | Single layer | Single layer | Single layer |
| Casting, cutting, and grooving | sequential | sequential | sequential | sequential | sequential | sequential | sequential |
| Diisocyanate compound (% by weight) | 31.46 | 32.06 | 33.21 | 31.32 | 29.87 | 29.75 | 29.45 |
| Polymer-type polyol (PTMG) (% by weight) | 41.40 | 41.36 | 41.42 | 41.38 | 42.87 | 38.54 | 41.36 |
| Single-molecule-type polyol (DEG) (% by weight) | 4.39 | 4.38 | 4.39 | 4.35 | 4.54 | 3.95 | 4.28 |
| Curing agent (MOCA) (% by weight) | 18.64 | 18.92 | 18.94 | 18.62 | 19.37 | 19.35 | 15.32 |
| Content of surfactant (% by weight) | — | 0.50 | — | — | — | — | — |
| Content of solid phase foaming agent (% by weight) | 1.00 | 1.00 | 1.00 | 1.00 | 1.00 | 1.00 | 1.00 |
| Other additive compounds (% by weight) | 3.11 | 1.78 | 1.04 | 3.33 | 2.35 | 7.41 | 8.59 |
| Inert gas (l/min) | — | 1.0 | — | — | — | — | — |

TABLE 2-1

|  | Example | | | Comparative Example |
|---|---|---|---|---|
|  | 2-1 | 2-2 | 2-3 | 2-1 |
| Casting mold | Single layer | Single layer | Single layer | Single layer |
| Casting, cutting, and grooving | sequential | sequential | sequential | sequential |
| Alicyclic diisocyanate compound (H12MDI) (% by weight) | 3.27 | 3.20 | 3.20 | 3.31 |
| Aromatic diisocyanate compound (TDI) (% by weight) | 28.19 | 28.86 | 26.98 | 26.56 |
| Polyol (DEG) (% by weight) | 48.90 | 47.03 | 47.13 | 48.76 |
| Curing agent (MOCA) (% by weight) | 18.64 | 18.92 | 20.68 | 19.37 |
| Content of surfactant (% by weight) | — | 1.0 | 1.0 | — |
| Content of solid phase foaming agent (% by weight) | 1.0 | 1.0 | 1.0 | 1.0 |
| Inert gas (l/min) | — | 1 | 1 | — |

Test Example 1: Measurement of the Content of an Element in the Polishing Layer The content of each element and the total content thereof in the polishing layer of the polishing pad obtained in the Examples and Comparative Examples were measured using the element analyzer Flash2000 (Thermo Fisher Scientific, Germany). The element content was measured for the top pad of the polishing pad.

The results are shown in Tables 1-2 and 2-2 below. The weight percentage in Tables 1-2 and 2-2 below is calculated based on the total weight of the polishing layer.

TABLE 1-2

| Content of element (% by weight) | O | N + O | Total content of C, H, O, and N | (N + O + H)/ (total content of C, H, O, and N) | Content of other elements than C, H, O and N |
|---|---|---|---|---|---|
| Ex. 1-1 | 16.7 | 23.73 | 93.57 | 33.50 | 6.43 |
| Ex. 1-2 | 17.2 | 24.23 | 94.19 | 33.77 | 5.8 |
| Ex. 1-3 | 18.9 | 26.41 | 95.23 | 34.78 | 4.77 |
| Ex. 1-4 | 15.4 | 22.53 | 92.65 | 33.60 | 7.35 |
| C. Ex. 1-1 | 19.2 | 25.87 | 96.18 | 35.10 | 3.81 |
| C. Ex. 1-2 | 14.3 | 21.49 | 91.56 | 33.48 | 8.44 |
| C. Ex. 1-3 | 16.2 | 18.79 | 93.52 | 30.47 | 6.48 |

As can be seen from Table 1-2 above, the polishing pads prepared in Examples 1-1 to 1-4 had a content of the oxygen (O) element in the polishing layer within the range of 15% by weight to 19% by weight and a total content of the nitrogen (N) and oxygen (O) elements within the range of 20% by weight to 27% by weight.

In contrast, the polishing pad prepared in Comparative Example 1-1 had a content of the oxygen (O) element in the polishing layer exceeding 19% by weight, the polishing pad prepared in Comparative Example 1-2 had a content of the oxygen (O) element in the polishing layer of less than 15% by weight, and the polishing pad prepared in Comparative Example 1-3 had a total content of the nitrogen (N) and oxygen (O) elements of less than 20% by weight.

TABLE 2-2

| | Content of N (% by weight) | Total content of N, C, O, and H (% by weight) | Diisocyanate monomer Compound-derived N:Curing agent-derived N (molar ratio) | Alicyclic diisocyanate compound-derived N:Aromatic diisocyanate compound-derived N |
|---|---|---|---|---|
| Ex. 2-1 | 7.07 | 94.19 | 2.50:1 | 0.074:1 |
| Ex. 2-2 | 7.05 | 93.57 | 2.49:1 | 0.077:1 |
| Ex. 2-3 | 7.16 | 94.16 | 2.15:1 | 0.079:1 |
| C. Ex. 2-1 | 6.70 | 96.18 | 2.27:1 | 0.083:1 |

As can be seen from Table 2-2 above, the polishing pads prepared in Examples 2-1 to 2-3 had a content of the nitrogen (N) element in the polishing layer of 7% by weight or more and a total content of the nitrogen (N), carbon (C), oxygen (O), and hydrogen (H) elements within the range of 90% by weight to 96% by weight.

In contrast, the polishing pad prepared in Comparative Example 2-1 had a very low content of the nitrogen (N) element in the polishing layer of 6.70% by weight.

In addition, it was confirmed that the content of the nitrogen (N) element in the polishing layer of the polishing pads of the Examples and the Comparative Examples vary with the contents and molar ratios of the curing agent, the alicyclic diisocyanate compound, and the aromatic diisocyanate compound.

Test Example 2: Physical Properties of the Polishing Pad

The polishing pads prepared in the Examples and the Comparative Example were tested for the following items regarding their physical properties. The results are shown in Table 1-3 below.

(1) Hardness

The Shore D hardness of the polishing pads prepared in the Examples and the Comparative Examples was measured. The polishing pads prepared in the Examples and the Comparative Examples were each cut into a size of 2 cm×2 cm (thickness: 2 mm) and then allowed to stand for 16 hours in an environment of a temperature of 23±2° C. and a humidity of 50±5%. Thereafter, the hardness of the multi-layer polishing pad was measured using a hardness meter (D-type hardness meter).

(2) Specific Gravity

The polishing pads prepared in the Examples and the Comparative Examples were each cut into a rectangle of 4 cm×8.5 cm (thickness: 2 mm) and then allowed to stand for 16 hours in an environment of a temperature of 23±2° C. and a humidity of 50±5%. The specific gravity of the polishing pad was measured using a gravimeter.

(3) Tensile Strength

The polishing pads prepared in the Examples and the Comparative Examples were each cut to 4 cm×1 cm (thickness: 2 mm). The ultimate strength immediately before the fracture was measured while the polishing pad was tested at a rate of 50 mm/min using a universal testing machine (UTM).

(4) Elongation

The polishing pads prepared in the Examples and the Comparative Examples were each cut to 4 cm×1 cm (thickness: 2 mm). The maximum deformation immediately before the fracture was measured while the polishing pad was tested at a rate of 50 mm/min using a universal testing machine (UTM). The ratio of the maximum deformation to the initial length was expressed in percent (%).

(5) Modulus

The polishing pads prepared in the Examples and the Comparative Examples were each subjected to the same measuring method as that for tensile strength below. The slope of the strain-stress curve in the initial elastic region was calculated.

(6) Characteristics of Pores

The cross-section of each of the polishing pads of the Examples and the Comparative Examples was observed by scanning electron microscopy (SEM).

In addition, the characteristics of the pores were calculated based on the SEM images, which are summarized in Tables 1-3 and 2-4 below.

Number average diameter: average of the sum of the pore diameters divided by the number of pores on the SEM image Number of pores: number of pores per 0.3 $cm^3$ on the SEM image Pore area ratio: percentage of the area of the pores relative to the total area of the SEM image In addition, the pores of the polishing pads of Example 2-1 and Comparative Example 2-1 were observed by scanning electron microscopy (SEM) and are shown in FIGS. 1 and 2, respectively. As can be seen from FIGS. 1 and 2, the pores in the polishing pad of Example 2-1 were finely and uniformly distributed over a large area as compared with the polishing pad of Comparative Example 2-1.

TABLE 1-3

| | | | Example | | | | Comparative Example | | |
|---|---|---|---|---|---|---|---|---|---|
| | | Evaluation item | 1-1 | 1-2 | 1-3 | 1-4 | 1-1 | 1-2 | 1-3 |
| Physical properties | Upper pad | Thickness (mm) | 2 | 2 | 2 | 2 | 2 | 2 | 2 |
| | | Number average diameter of pores (μm) | 23.4 | 23.1 | 23.3 | 23.4 | 22.2 | 25.1 | 21.9 |
| | | Number of pores (per 0.3 $cm^3$) | 183 | 195 | 197 | 185 | 166 | 208 | 188 |
| | | Pore area ratio (%) | 41.65 | 44.06 | 44.56 | 40.87 | 39.72 | 46.21 | 40.18 |
| | | Specific gravity (g/cc) | 0.81 | 0.81 | 0.80 | 0.81 | 0.81 | 0.80 | 0.79 |
| | Lower pad | Type | NF | NF | NF | NF | NF | NF | NF |
| | | Thickness (mm) | 1.1 | 1.1 | 1.1 | 1.1 | 1.1 | 1.1 | 1.1 |
| | | Hardness (C) | 70 | 70 | 70 | 70 | 70 | 70 | 70 |
| | Laminated pad | Thickness (mm) | 3.32 | 3.32 | 3.32 | 3.32 | 3.32 | 3.32 | 3.32 |
| | | Compression rate (%) | 1.05 | 1.05 | 1.05 | 1.05 | 1.05 | 1.05 | 1.05 |

*NF: nonwoven fabric

As can be seen from Table 1-3 above, the polishing pads prepared in Examples 1-1 to 1-4 had a number average diameter of pores of about 20 to 26 μm and a pore area ratio of about 41% to 45%.

TABLE 2-3

| | | | Example | | | Comparative Example |
|---|---|---|---|---|---|---|
| | | Evaluation item | 2-1 | 2-2 | 2-3 | 2-1 |
| Physical properties | Upper pad | Thickness (mm) | 2 | 2 | 2 | 2 |
| | | Hardness (Shore D) | 58.4 | 58 | 59.2 | 42 |
| | | Average pore size (μm) | 23.4 | 23.1 | 22.2 | 23.6 |
| | | Specific gravity (g/cc) | 0.81 | 0.81 | 0.82 | 0.81 |
| | | Tensile strength (N/$mm^2$) | 22.5 | 22.2 | 23.5 | 15.3 |
| | | Elongation (%) | 105.6 | 103.7 | 116.1 | 91.3 |
| | | Modulus (kgf/$cm^2$) | 72.6 | 72.4 | 110 | 41.6 |
| | Lower pad | Type | Nonwoven fabric | Nonwoven fabric | Nonwoven fabric | Nonwoven fabric |
| | | Thickness (mm) | 1.1 | 1.1 | 1.1 | 1.1 |
| | | Hardness (C) | 70 | 70 | 70 | 70 |
| | Laminated pad | Thickness (mm) | 3.32 | 3.32 | 3.32 | 3.32 |
| | | Compression rate (%) | 1.05 | 1.05 | 1.05 | 1.05 |

As can be seen from Table 2-3 above, the polishing pads prepared in Examples 2-1 and 2-3 were remarkably excellent in hardness, tensile strength, elongation, and modulus as compared with those of Comparative Example 2-1.

Specifically, when the content of the nitrogen (N) element in the polishing layer was 7% by weight or more and when the total content of the nitrogen (N), carbon (C), oxygen (O), and hydrogen (H) elements was 90% by weight to 96% by weight as in Examples 2-1 to 2-3, the polishing pads were excellent in hardness, tensile strength, elongation, and modulus as compared with that of Comparative Example 2-1 that fell outside the ranges. In particular, the hardness, tensile strength, elongation, and modulus were all enhanced as the content of the nitrogen (N) element increased.

When the content of the nitrogen (N) element in the polishing layer was 6.70% by weight as in Comparative Example 2-1, the hardness was reduced by about 29% the tensile strength was reduced by about 30% or more, the elongation was reduced by 21%, and the modulus was reduced by 60% or more as compared with Example 2-3.

TABLE 2-4

|  | Ex. 2-1 | Ex. 2-2 | Ex. 2-3 | C. Ex. 2-1 |
|---|---|---|---|---|
| Number average diameter (μm) | 23.4 | 23.1 | 22.2 | 23.6 |
| Number of pores (per 0.3 cm$^3$) | 185 | 183 | 195 | 166 |
| Pore area ratio (%) | 42.05 | 41.65 | 44.06 | 39.72 |

As can be seen from Table 2-4 above, the polishing pads prepared in Examples 2-1 to 2-3 had a number average diameter of pores of about 20 to 26 μm and a pore area ratio of about 41% to 45%.

(7) Polishing Rate (or Removal Rate)

<Measurement of the Polishing Rate for an Oxide Layer>

The initial polishing rate immediately after the polishing pad had been prepared was measured as follows.

A silicon semiconductor substrate having a diameter of 300 mm was deposited with silicon oxide by a CVD process. The polishing pad was mounted on a CMP machine, and the silicon semiconductor substrate was set with the silicon oxide layer thereof facing the polishing surface of the polishing pad. Thereafter, the silicon oxide layer was polished under a polishing load of 4.0 psi while the silicon wafer was rotated at a speed of 150 rpm, the platen was rotated at a speed of 150 rpm for 60 seconds, and a calcined ceria slurry was supplied on the polishing pad at a rate of 250 ml/min. Upon completion of the polishing, the silicon wafer was detached from the carrier, mounted in a spin dryer, washed with deionized water (DIW), and then dried with nitrogen (N$_2$) for 15 seconds. The film thickness of the dried silicon wafer was measured before and after the polishing using a spectral reflectometer type thickness measuring instrument (Manufacturer: Kyence, Model: SI-F80R). The polishing rate was calculated using the following Equation 1.

<Measurement of the Polishing Rate for a Tungsten (W) Layer>

A silicon semiconductor substrate having a diameter of 300 mm was deposited with a tungsten (W) layer by a CVD process. The polishing pad was mounted on a CMP machine, and the silicon semiconductor substrate was set with the tungsten layer thereof facing the polishing surface of the polishing pad. Thereafter, the tungsten layer was polished under a polishing load of 4.0 psi while the silicon wafer was rotated at a speed of 150 rpm, the platen was rotated at a speed of 150 rpm for 60 seconds, and a fumed silica slurry was supplied on the polishing pad at a rate of 250 ml/min. Upon completion of the polishing, the silicon wafer was detached from the carrier, mounted in a spin dryer, washed with deionized water (DIW), and then dried with nitrogen (N$_2$) for 15 seconds. The film thickness of the dried silicon wafer was measured before and after the polishing using a spectral reflectometer type thickness measuring instrument (Manufacturer: Kyence, Model: SI-F80R). The polishing rate was calculated using the following Equation 1.

Polishing rate (Å/min)=polished thickness of a silicon wafer (Å)/polishing time (minute)  [Equation 1]

TABLE 1-4

|  |  | Example | | | | Comparative Example | | |
|---|---|---|---|---|---|---|---|---|
|  |  | 1-1 | 1-2 | 1-3 | 1-4 | 1-1 | 1-2 | 1-3 |
| Ceria slurry | Polishing rate (Å/min) | 3807 | 3724 | 3628 | 3910 | 2809 | 4238 | 4108 |
|  | Scratch (number) | 2 | 1 | 1 | 3 | 11 | 15 | 18 |

As can be seen from Table 1-4 above and FIG. 3, the content of the oxygen (O) element and the total content of the nitrogen (N) and oxygen (O) elements in the polishing layer of the polishing pads of Examples 1-1 to 1-4 were within the scope of the present invention, in which the polishing rate for an oxide layer was about 3,628 Å/min to 3,910 Å/min and the number of scratches was significantly reduced to 1 to 3 as compared with Comparative Examples 1-1 to 1-3.

In contrast, the polishing pad of Comparative Example 1-1 had a polishing rate for an oxide layer of about 2,809 Å/min, which was remarkably reduced by 20% or more as compared with the polishing pads of Examples 1-1 to 1-4. It appears that since the content of the oxygen (O) element was excessive as 19.2% by weight based on the total weight of the polishing layer, the bonding strength between the ceria (CeO$_2$) particles used for polishing and the polishing pad was excessively increased, which reduced the bonding strength between the ceria (CeO$_2$) particles and the wafer, thereby adversely affecting the polishing rate.

In addition, the polishing pads of Comparative Examples 1-2 and 1-3 had an excessively high polishing rate of about 4,108 Å/min or more and a remarkably increased number of scratches of 15 or more as compared with Examples 1-1 to 1-4. It appears that the content of the oxygen (O) element or the total content of the nitrogen (N) and oxygen (O) elements fell outside the scope of the present invention, which adversely affected the polishing rate and scratches.

TABLE 2-5

|  |  | Ex. 2-1 | Ex. 2-2 | Ex. 2-3 | C. Ex. 2-1 |
|---|---|---|---|---|---|
| Fumed silica slurry | Polishing rate (Å/min) | 564.7 | 570.5 | 440.6 | 686.1 |

As can be seen from Table 2-5 above and FIG. 4, the content of the nitrogen (N) element in the polishing layer of the polishing pads of Examples 2-1 to 2-3 were 7% by weight to 10% by weight within the scope of the present invention, in which the polishing rate satisfied the range of about 400 Å/min to 650 Å/min. In contrast, the content of the nitrogen (N) element in the polishing pad of Comparative Example 2-1 was less than 7% by weight, in which the initial polishing rate was rapidly increased to 686.1 Å/min and fell outside the suitable range of polishing rate.

In particular, since the content of the nitrogen (N) element in the polishing layer of the polishing pads of Examples 2-1 to 2-3 satisfied the above range, the carried amount of slurry was increased, thereby enhancing the polishing rate.

REFERENCE NUMERAL OF THE DRAWINGS

210: polishing pad
220: platen
230: semiconductor substrate
240: nozzle
250: polishing slurry
260: polishing head
270: conditioner

The invention claimed is:

1. A polishing pad, which comprises a polishing layer comprising a cured product of a composition comprising a urethane-based prepolymer, a curing agent, and a foaming agent,
wherein a content of elemental oxygen (O) in the polishing layer is 15% by weight to 19% by weight based on a total weight of the polishing layer, and
a total content of elemental nitrogen (N) and oxygen (O) the polishing layer is 20% by weight to 27% by weight based on the total weight of the polishing layer.

2. The polishing pad of claim 1, wherein the total content of the carbon (C), nitrogen (N), oxygen (O), and hydrogen (H) elements is 92% by weight to 96% by weight based on the total weight of the polishing layer, or
the total content of the nitrogen (N), oxygen (O), and hydrogen (H) elements in the polishing layer is 30% by weight to 35% by weight based on the total content of the carbon (C), nitrogen (N), oxygen (O), and hydrogen (H) elements in the polishing layer, or
both of which are satisfied.

3. The polishing pad of claim 1, wherein the urethane-based prepolymer comprises a prepolymerization reaction product of at least one diisocyanate compound and at least two polyols, the at least two polyols are at least one single-molecule-type polyol and at least one polymer-type polyol, and the polishing pad satisfies at least one of:
a mixed weight ratio of the diisocyanate compound and the polyol of 1:1.35 to 1.55;
a mixed weight ratio of the single-molecule-type polyol and the polymer-type polyol of 1:8 to 10;
a mixed weight ratio of the diisocyanate compound and the polymer-type polyol of 1:1.2 to 1.43; and
a mixed weight ratio of the diisocyanate compound and the single-molecule-type polyol of 1:0.11 to 0.15.

4. The polishing pad of claim 3, wherein the oxygen (O) element in the polishing layer is derived from the diisocyanate compound and the polyol, and
the molar ratio of the oxygen (O) element derived from the polyol and the oxygen (O) element derived from the diisocyanate compound is 1:0.1 to 0.5.

5. The polishing pad of claim 3, which, based on the total weight of the composition, satisfies at least one of:
29.9% by weight to 35% by weight of the diisocyanate compound;
35% by weight to 42.8% by weight of the polymer-type polyol;
4.0% by weight to 4.5% by weight of the single-molecule-type polyol; and
16.0% by weight to 20% by weight of the curing agent.

6. The polishing pad of claim 3, wherein the polymer-type polyol comprises at least one selected from the group consisting of a polytetramethylene glycol (PTMG), a polytetramethylene ether glycol (PTMEG), a polyether polyol, a polyester polyol, a polycarbonate polyol, and a polycaprolactone polyol, and
the single-molecule-type polyol comprises at least one selected from the group consisting of ethylene glycol (EG), diethylene glycol (DEG), propylene glycol (PG), propanediol (PDO), and methyl propanediol (MP-diol).

7. The polishing pad of claim 1, wherein the curing agent comprises at least one selected from the group consisting of 4,4'-methylenebis(2-chloroaniline) (MOCA), diethyltoluenediamine (DETDA), diaminodiphenylmethane, diaminodiphenyl sulphone, m-xylylenediamine, isophoronediamine, ethylenediamine, diethylenetriamine, triethylenetetramine, polypropylenediamine, polypropylenetriamine, and bis(4-amino-3-chlorophenyl)methane.

8. The polishing pad of claim 1, which has a polishing rate (or removal rate) of 3,000 Å/min to 4,000 Å/min for an oxide layer.

9. A process for preparing the polishing pad of claim 1, which comprises sequentially or simultaneously mixing a urethane-based prepolymer, a curing agent, and a foaming agent to prepare a composition; and injecting the composition into a mold and curing it to form the polishing layer.

10. A process for preparing a semiconductor device using the polishing pad of claim 1, which comprises mounting the polishing pad comprising the polishing layer on a platen; and relatively rotating the polishing surface of the polishing layer and the surface of a semiconductor substrate while the polishing layer and the surface of the semiconductor substrate are in contact with each other to polish the surface of the semiconductor substrate.

11. A polishing pad, which comprises a polishing layer comprising a cured product of a composition comprising a urethane-based prepolymer, a curing agent, and a foaming agent,
wherein a content of elemental nitrogen (N) in the polishing layer is 7% by weight or more based on a total weight of the polishing layer, and
a total content of the elemental nitrogen (N), and elemental carbon (C), oxygen (O), and hydrogen (H) in the polishing layer is 90% to 96% by weight based on the total weight of the polishing layer.

12. The polishing pad of claim 11, wherein the content of the nitrogen (N) element in the polishing layer is 7% by weight to 10% by weight based on the total weight of the polishing layer.

13. The polishing pad of claim 11, wherein the urethane-based prepolymer comprises a prepolymerization reaction product of at least two diisocyanate compounds and at least one polyol, and the at least two diisocyanate compounds comprise at least one alicyclic diisocyanate compound and at least one aromatic diisocyanate compound.

14. The polishing pad of claim 13, wherein the nitrogen (N) element in the polishing layer is derived from the curing agent, the alicyclic diisocyanate compound, and the aromatic diisocyanate compound, and the polishing pad satisfies at least one of:
a molar ratio of the nitrogen (N) element derived from the diisocyanate compound and the nitrogen (N) element derived from the curing agent of 2.0 to 2.7:1;
a molar ratio of the nitrogen (N) element derived from the alicyclic diisocyanate compound and the nitrogen (N) element derived from the aromatic diisocyanate compound of 0.05 to 0.082:1; and a mixed weight ratio of the alicyclic diisocyanate compound and the aromatic diisocyanate compound of 1:7 to 10.

15. The polishing pad of claim 13, wherein the content of the alicyclic diisocyanate compound is 2.5% by weight to 3.30% by weight based on the total weight of the composition, the content of the aromatic diisocyanate compound is 26.7% by weight to 30.0% by weight based on the total weight of the composition, and the content of the curing agent is 17.0% by weight to 22% by weight based on the total weight of the composition.

16. The polishing pad of claim 13, wherein the alicyclic diisocyanate compound comprises at least one selected from the group consisting of 4,4'-dicyclohexylmethane diisocyanate (H12MDI), isophorone diisocyanate (IPDI), and 1,4-cyclohexylmethane diisocyanate (CHDI), the aromatic diisocyanate compound comprises at least one selected from the group consisting of diphenylmethane diisocyanate (MDI), toluene diisocyanate (TDI), carbodiimide-modified 4,4'-diphenylmethane diisocyanate, and polymeric 4,4'-diphenylmethane diisocyanate, and the curing agent comprises at least one selected from the group consisting of 4,4'-methylenebis(2-chloroaniline) (MOCA), diethyltoluenediamine (DETDA), diaminodiphenylmethane, diaminodiphenyl sulphone, m-xylylenediamine, isophoronediamine, ethylenediamine, diethylenetriamine, triethylenetetramine, polypropylenediamine, polypropylenetriamine, and bis(4-amino-3-chlorophenyl)methane.

17. The polishing pad of claim 13, wherein the urethane-based prepolymer comprises 8% by weight to 12% by weight of diisocyanate compound end groups, and the molar equivalent ratio of the diisocyanate compound end group of the urethane-based prepolymer and the amine group of the curing agent is 1:0.8 to 1.2.

18. The polishing pad of claim 11, wherein the polishing layer has a tensile strength of 16 N/mm$^2$ to 25 N/mm$^2$, an elongation of 95% to 200%, a hardness of 45 Shore D to 80 Shore D, and a modulus of 50 kgf/cm$^2$ to 130 kgf/cm$^2$, and the polishing pad has a polishing rate (or removal rate) of 400 Å/min to 650 Å/min for a tungsten layer.

19. A process for preparing the polishing pad of claim 11, which comprises sequentially or simultaneously mixing a urethane-based prepolymer, a curing agent, and a foaming agent to prepare a composition; and injecting the composition into a mold and curing it to form the polishing layer.

20. A process for preparing a semiconductor device using the polishing pad of claim 11, which comprises mounting the polishing pad comprising the polishing layer on a platen; and relatively rotating the polishing surface of the polishing layer and the surface of a semiconductor substrate while the polishing layer and the surface of the semiconductor substrate are in contact with each other to polish the surface of the semiconductor substrate.

* * * * *